(12) United States Patent
Ooigawa et al.

(10) Patent No.: US 6,181,000 B1
(45) Date of Patent: Jan. 30, 2001

(54) LEAD FRAME FOR BALL GRID ARRAY, SEMICONDUCTOR DEVICE HAVING IT, AND PROCESS FOR PRODUCING IT

(75) Inventors: Kinya Ooigawa, Hanno; Tayuru Yoshida, Oume; Naoki Nakagawa, Hamura, all of (JP)

(73) Assignee: Sumitomo Metal Mining Co., Ltd., Tokyo (JP)

( * ) Notice: Under 35 U.S.C. 154(b), the term of this patent shall be extended for 0 days.

(21) Appl. No.: 09/028,060

(22) Filed: Feb. 23, 1998

(30) Foreign Application Priority Data

Mar. 24, 1997 (JP) ...................................... 9-069875

(51) Int. Cl.⁷ ................................................ H01L 23/495
(52) U.S. Cl. ................................................ 257/676
(58) Field of Search .................... 257/676, 737, 257/738, 784, 780

(56) References Cited

U.S. PATENT DOCUMENTS

| | | | |
|---|---|---|---|
| 4,685,210 | * 8/1987 | King et al. | 29/874 |
| 5,442,230 | * 8/1995 | Chillara et al. | 257/666 |
| 5,468,999 | * 11/1995 | Lin et al. | 257/784 |
| 5,522,133 | * 6/1996 | Kawauchi | 29/830 |
| 5,559,366 | * 9/1996 | Fogal et al. | 257/666 |
| 5,663,593 | * 9/1997 | Mostafazadeh et al. | 257/666 |
| 5,663,594 | * 9/1997 | Kimura | 257/666 |
| 5,767,575 | * 6/1998 | Lan et al. | 257/701 |
| 5,847,455 | * 12/1998 | Manteghi | 257/737 |

* cited by examiner

Primary Examiner—Carl Whitehead, Jr.
Assistant Examiner—Jeff Vockrodt
(74) Attorney, Agent, or Firm—Dykema Gossett PLLC

(57) ABSTRACT

A lead frame for ball grid array which is composed of a plurality of inner leads extending from outside to inside and having terminal ball bumps formed somewhere along them, characterized in that said terminal ball bumps are formed in at least two rows, with adjacent ones not overlapping in the lengthwise direction of the inner lead and said rows holding the bonding area between them. The bonding area may plated according to need. The lead frame can be produced in high yields without reduction in the number of pins. Disclosed also herein are a semiconductor device using said lead frame and a process for producing the same.

9 Claims, 2 Drawing Sheets

PRIOR ART

LEAD FRAME FOR BALL GRID ARRAY, SEMICONDUCTOR DEVICE HAVING IT, AND PROCESS FOR PRODUCING IT

BACKGROUND OF THE INVENTION

1. Field of the Invention

The present invention relates to a semiconductor device, particularly to a semiconductor device having a lead frame, and more particularly to a lead frame for ball grid array, a semiconductor device having it, and a process for producing it.

2. Description of the Prior Art

Recent semiconductor devices need a higher degree of integration and more functions than before to meet requirements for electronic machines and equipment which are improving in performance and becoming light in weight and small in size. However, this need is not met by conventional QFP (Quad Flat Package) which becomes larger in size and whose external terminals become narrower in pitch as the number of lead frame pins increases. As the result, lead frames are more liable to deformation and defective mounting is liable to occur more frequently.

In order to eliminate this disadvantage, there has been developed the ball grid array (BGA) which uses external terminals with solder balls for the mounting of a semiconductor device.

The BGA enables the lead frame to have more widely pitched external terminals and hence it enables the number of external terminals to increase without adverse effect on the mounting of semiconductor devices.

The lead frame for BGA is usually constructed as shown in FIG. 4. It is formed by etching or pressing. Like conventional QFP, it is designed such that a semiconductor chip is mounted on the die pad and the forward ends of the inner leads are connected by wire bonding to the terminals of the semiconductor element. It differs from QFP in that the terminals for mounting are ball bumps.

The conventional lead frame shown in FIG. 4 suffers the disadvantage that the forward ends 2 of the inner leads with terminal ball bumps 1 have extremely narrow spaces because they are connected by wiring bonding to the semiconductor element. Producing such lead frames with high precision by etching or pressing is necessarily low in yields.

SUMMARY OF THE INVENTION

It is an object of the present invention to provide a new lead frame for BGA which permits the number of pins to increase without adverse effect on its function, a semiconductor device having it, and a process for producing it in high yields.

The first aspect of the present invention resides in a lead frame for ball grid array which is composed of a plurality of inner leads extending from outside to inside and having terminal ball bumps formed somewhere along them, characterized in that the terminal ball bumps are formed in at least two rows, with adjacent ones not overlapping in the lengthwise direction of the inner lead and the rows holding the bonding area between them.

In the first aspect of the present invention, the bonding area should preferably be formed at the middle of the rows of the terminal ball bumps and at least the bonding area should preferably be plated with gold, silver, or palladium.

Moreover, in the first aspect of the present invention, the inner leads should preferably have their tips cut short and formed wide by patterning or coining with the corresponding width.

The second aspect of the present invention resides in a semiconductor device which comprises a semiconductor element mounted on a lead frame for ball grid array which is composed of a plurality of inner leads extending from outside to inside and having terminal ball bumps formed an alternately coinciding manner somewhere along them in at least two rows, with the rows holding the bonding area between them, the ball bumps having solder balls joined to them. The semiconductor element is mounted by means of an adhesive tape based on a thermoplastic resin adhesive or thermosetting resin adhesive.

The third aspect of the present invention resides in a process for producing a semiconductor device which comprises bonding a semiconductor element to an approximately central part of a lead frame for ball grid array with an adhesive layer interposed in-between, connecting by wire bonding the terminals of the semiconductor element to the boding area of the inner lead, performing molding with a molding resin, connecting solder balls to the terminal ball bumps, and removing unnecessary parts of the inner lead, the lead frame being composed of a plurality of inner leads extending from outside to inside and having terminal ball bumps formed an alternately coinciding manner somewhere along them in at least two rows, with said rows holding the bonding area between them, said ball bumps having solder balls joined to them. The adhesive tape is one which is based on a thermoplastic resin adhesive or thermosetting resin adhesive.

DETAILED DESCRIPTION OF REFERRED EMBODIMENTS

The lead frame for BGA pertaining to the present invention has no die pad unlike the conventional one. Therefore, it needs the step of sticking an adhesive tape to the tips of the lead frame and mounting a semiconductor element by means of the adhesive tape at the time of assembly.

Figure 1:
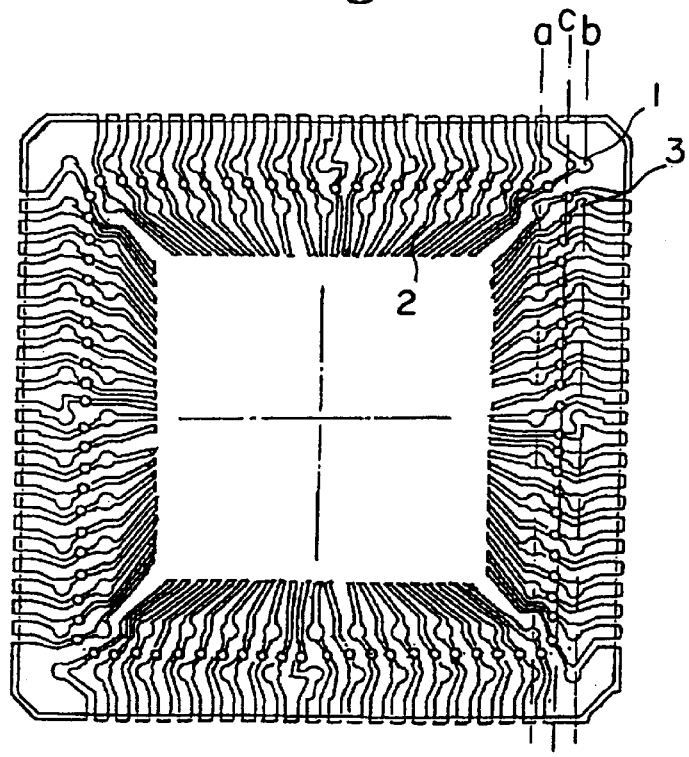
FIG. 1 is a schematic plan view showing one embodiment of the lead frame for BGA pertaining to the present invention.

The invention will be described with reference to the accompanying drawings. FIG. 1 shows an embodiment of the lead frame for BGA pertaining to the present invention. The lead frame has a plurality of inner leads 2 extending (in four directions) from outside to inside, each inner lead having a terminal ball bump 1 formed somewhere along it. The inner leads 2 are shorter than conventional inner leads but are long enough to hold the semiconductor element by means of the above-mentioned adhesive tape (see FIG. 3)

The terminal ball bumps 1 are formed on the inner leads 2 such that they do not overlap in the lengthwise direction of the adjacent inner leads 2 but coincide with the lines a and b parallel to each side of the lead frame. In the embodiment shown in FIG. 1, the terminal ball bumps 1 are arranged in two rows along the lines a and b, but they may be arranged in three or more rows. Too many rows are economically disadvantageous because it is necessary to elongate the inner lead 2. On each inner lead 2 is formed the bonding area 3, which coincides with the line c between the lines a and b.

The bonding area 3 may be plated with gold, silver, palladium, or the like, if necessary.

Figure 2:
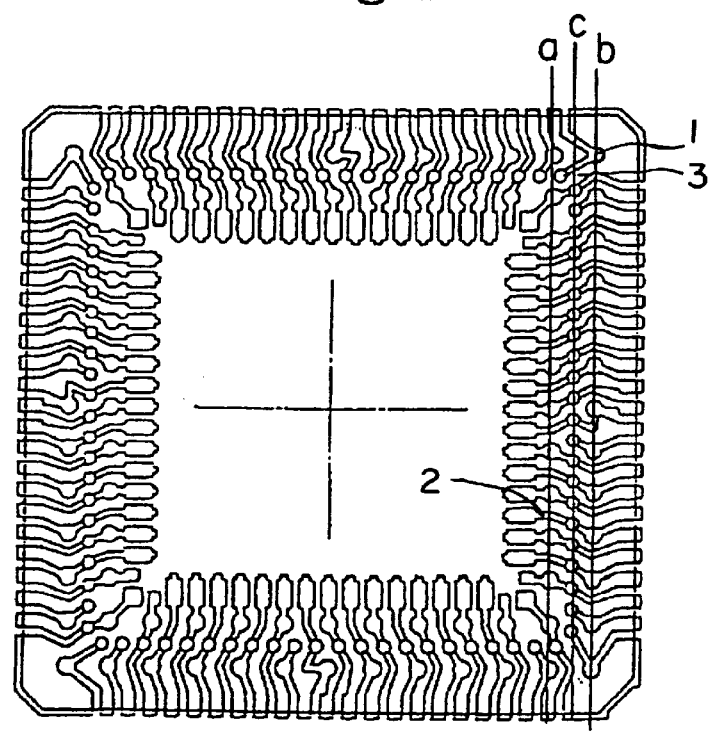
FIG. 2 is a schematic plan view showing another embodiment of the lead frame for BGA pertaining to the present invention, said embodiment being characterized in that the tips of the lead frame are cut short and formed wide to provide the bonding area for the adhesive tape used to mount the semiconductor element.

FIG. 2 is a schematic plan view showing another embodiment of the lead frame for BGA pertaining to the present invention. In this embodiment, the inner lead 2 has its tip cut short and formed wide so as to provide the bonding area for the adhesive tape used to mount the semiconductor element. The wide tip may be formed by patterning or coining. Incidentally, the bonding area 3 may be plated with gold, silver, palladium, or the like, if necessary.

The lead frame shown in FIG. 1 or FIG. 2 can be produced easily by etching or press.

Figure 3:
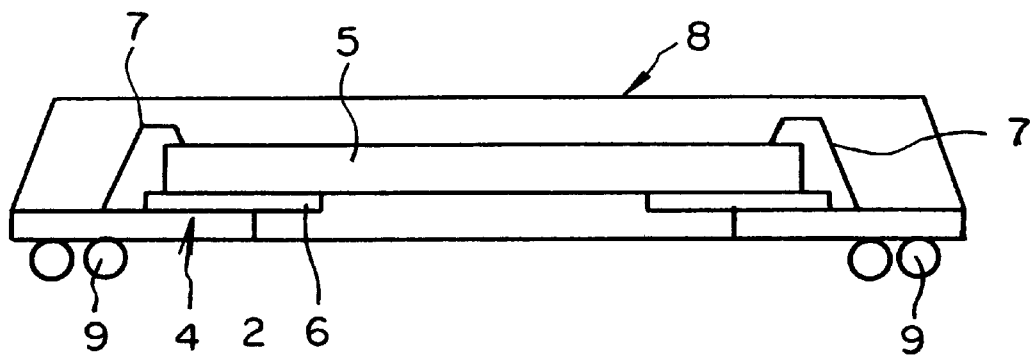
FIG. 3 is a schematic sectional view showing one embodiment of the semiconductor device assembled by using the lead frame for BGA as shown in FIG. 2.
Figure 4:
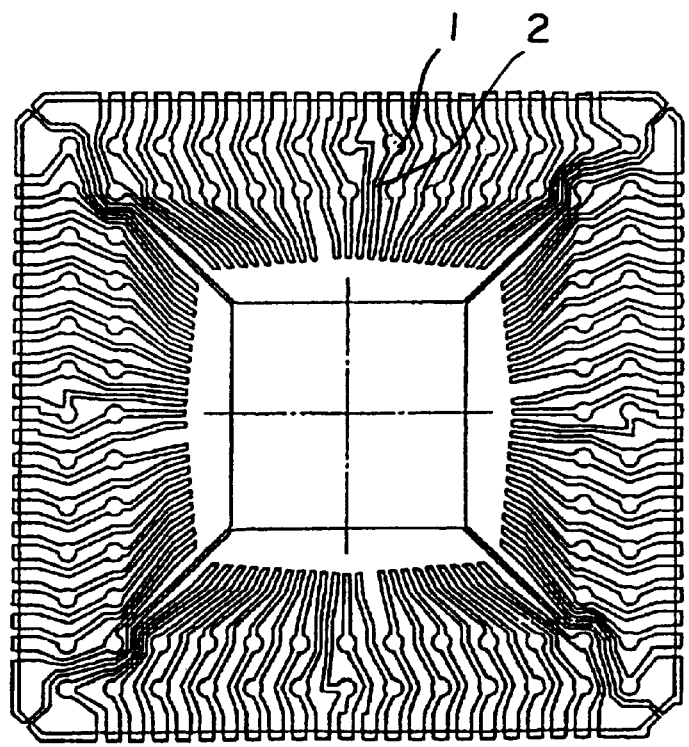
FIG. 4 is a schematic plan view showing a conventional lead frame for BGA.

FIG. 3 is a sectional view showing one embodiment of the semiconductor device pertaining to the present invention. This semiconductor device is constructed such that the semiconductor element 5 is mounted on the lead frame 4 (the one shown in FIG. 2) by means of the adhesive tape 6, the terminals of the semiconductor element 5 are connected by wire bonding 7 to the bonding areas 3 of the inner leads 2, the entire assembly is molded by the molding resin 8, and the solder balls 9 are joined to the terminal ball bumps 1 of the inner leads 2. This semiconductor device is mounted on the wiring board by means of the solder balls in the usual way.

The semiconductor device shown in FIG. 3 is assembled in the following manner. First, the adhesive tape 6 of desired size is stuck to that part of the lead frame (the one shown in FIG. 2) on which the semiconductor element is to be mounted. The adhesive tape 6 may be of either thermoplastic resin type or thermosetting resin type.

Second, the terminals of the semiconductor elements 5 are connected by wire bonding 7 to the bonding areas 3 of the inner leads 2. Third, the resulting assembly is molded with the molding resin 8. Fourth, the solder balls 9 are joined to the terminal ball bumps 1. Finally, the unnecessary parts of the inner leads 2 are removed by cutting.

The lead frame for BGA pertaining to the present invention has the bonding area 3 between the terminal ball bumps 1. This offers the advantage of reducing the length of the inner leads 2 of the lead frame and hence increasing the lead space between the tips of the inner leads 2. This in turn increases yields in the production of lead frames by etching or pressing.

What is claimed is:

1. A semiconductor device which comprises a semiconductor element mounted on a generally rectangular lead frame for a ball grid which has four sides and includes a plurality of generally aligned inner leads that extend from an outside to an inside of at least one of said four sides, each inner lead defining a terminal ball bump and a bonding area, the terminal ball bumps of adjacent inner leads being aligned on different parallel ball bump lines, the parallel ball bump lines being substantially defined by the terminal ball bumps on every other inner lead, and the bonding areas of said inner leads being aligned on a bonding line which extends in parallel with and between said ball bump lines.

2. The semiconductor device as defined in claim 1, wherein the semiconductor element is mounted by means of an adhesive tape.

3. The semiconductor device as defined in claim 2, wherein the adhesive tape is one which is based on a thermoplastic resin adhesive or thermosetting resin adhesive.

4. A generally rectangular lead frame for a ball grid array which has four sides and includes a plurality of generally aligned inner leads that extend on one surface from an outside to an inside of at least one of said four sides, each inner lead defining a terminal ball bump and a bonding area, the terminal ball bumps of adjacent inner leads being aligned on different parallel ball bump lines, the parallel ball bump lines being substantially defined by the terminal ball bumps on every other inner lead, and the bonding areas of said inner leads being aligned on a bonding line which extends in parallel with and between said ball bump lines.

5. The lead frame for a ball grid array as defined in claim 4, wherein the bonding areas are located at the middle of the rows of the terminal ball bumps.

6. The lead frame for ball grid array as defined claim 4, wherein at least the bonding areas are plated.

7. The lead frame for ball grid array as defined in claim 6, wherein the plating is gold, silver, or palladium plating.

8. The lead frame for ball grid array as defined claim 4, wherein the inner leads have tips which are cut short and are wide.

9. The lead frame for ball grid array as defined in claim 4, wherein tips of the inner leads are formed by patterning or coining with the corresponding width.

* * * * *